United States Patent

Morgan

[15] 3,657,617

[45] Apr. 18, 1972

[54] POINT CONTACT SEMICONDUCTOR DEVICE

[72] Inventor: Cyril Morgan, Marblehead, Mass.

[73] Assignee: Alpha Industries, Inc., Newton, Mass.

[22] Filed: July 9, 1970

[21] Appl. No.: 53,533

[52] U.S. Cl. .......... 317/236, 317/234

[51] Int. Cl. .......... H01l 5/04

[58] Field of Search .......... 317/236

[56] References Cited

UNITED STATES PATENTS

| | | | |
|---|---|---|---|
| 2,724,761 | 11/1955 | Cisne | 317/236 |
| 2,876,400 | 3/1959 | Gunther et al. | 317/235 |
| 3,458,778 | 7/1969 | Genzabella et al. | 317/234 |

*Primary Examiner*—James D. Kallam

*Attorney*—Charles Hieken

[57] ABSTRACT

Point contact semiconductor diode including a catwhisker of tungsten or molybdenum having its pointed tip coated with a thin layer of chromium, nickel-chromium, cobalt, platinum, or an alloy of chromium and platinum.

7 Claims, 3 Drawing Figures

INVENTOR

CYRIL MORGAN by David M. Kay
Agent

*INVENTOR*

CYRIL MORGAN by David M. Kay
Agent

POINT CONTACT SEMICONDUCTOR DEVICE

BACKGROUND OF THE INVENTION

This invention relates to semiconductor electrical translating devices. More particularly, it is concerned with semiconductor diodes having a body of semiconductor material and an electrode making rectifying point contact to a surface of the body.

Point contact semiconductor devices have been widely used, particularly in certain applications at microwave frequencies. One specific application for devices of this type has been as a mixer of signals at microwave frequencies in superheterodyne receiving apparatus. These devices employ a small chip or die of a semiconductor material, usually silicon. A pointed metal electrode or "catwhisker" presses against the surface of the semiconductor die and forms a rectifying connection therewith. Semiconductor devices of this basic structure have remained relatively unchanged since World War II.

The important characteristics of devices of this type are overall noise figure and burnout capability. The noise figure is a comparative criterion of the electrical characteristics of a device and the burnout capability is a measure of its ability to withstand high energy electrical pulses. Improvements have been made in these characteristics through improvements in the techniques of fabricating the semiconductor dice. However, it is desirable to further improve these characteristics which are significant to the results obtained when a device is employed as a mixer at microwave frequencies.

SUMMARY OF THE INVENTION

Semiconductor devices in accordance with the invention having improved noise figure and burnout capability include a body of semiconductor material and a pointed electrode of tungsten or molybdenum. The pointed tip of the electrode is coated with chromium, nickel-chromium, cobalt, platinum, or an alloy of chromium and platinum. The body of semiconductor material and the electrode are supported within an enclosure with the coated tip of the electrode making point contact rectifying connection with a surface of the body of semiconductor material.

BRIEF DESCRIPTION OF THE DRAWINGS

Additional objects, features, and advantages of semiconductor devices in accordance with the invention will be apparent from the following detailed discussion and the accompanying drawings wherein.

DETAILED DESCRIPTION OF THE INVENTION

Figure 1:
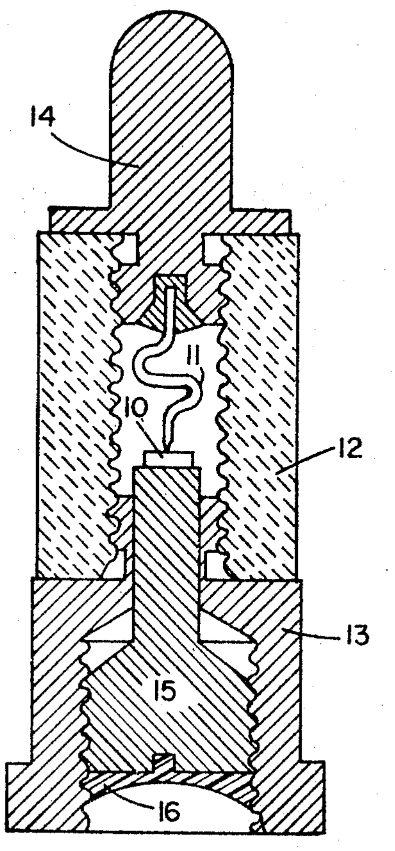
FIG. 1 is an elevational view in cross-section of a semiconductor diode in accordance with the invention.

FIG. 1 illustrates a semiconductor diode according to the invention. The diode is of the so-called cartridge configuration and is adapted to be inserted in standard holders in waveguide and coaxial cable for use as a mixer. The electrically active elements of the diode include a chip or die of semiconductor material 10 and a catwhisker electrode 11 making point contact rectifying connection with the die.

The enclosure or housing of the diode within which the electrically active elements are mounted includes a ceramic cylinder 12, a metal base 13, and a metal tip 14. The base 13 is threaded into one end of the ceramic cylinder 12 and the tip 14 is threaded into the other end. A plug 15 which is threaded into the base provides a support for the semiconductor die 10. The catwhisker electrode 11 is soldered to the inner end of the tip 14. The catwhisker is an S-shaped length of wire and is placed under slight compression in order to maintain proper contact pressure between the point of the catwhisker and the surface of the semiconductor die. A layer of epoxy cement 16 seals the plug 15 to the base 13 so as to prevent relative movement between the two.

Figure 2:
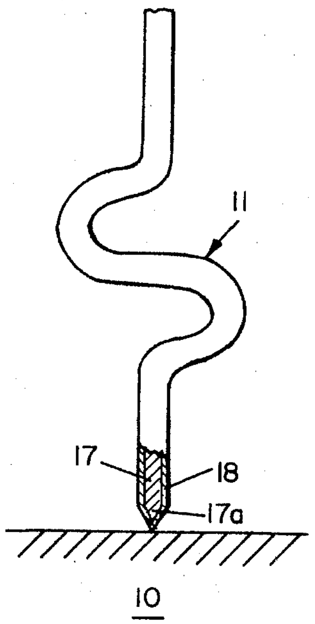
FIG. 2 is a detailed view of a fragment of the device of FIG. 1 illustrating details of the point contact electrode, and FIG. 3 includes diagrams showing the distribution of comparative overall noise figure in a typical lot of prior art devices and in a typical lot of devices according to the invention.

The pointed catwhisker electrode 11 of the devices in accordance with the invention is illustrated in greater detail in FIG. 2. The catwhisker is fabricated of a length of either tungsten or molybdenum wire 17 formed to an S-shaped configuration. The tip **17*a* of the catwhisker is pointed. In accordance with the present invention the whisker in the region of the tip is coated with a thin layer 18 of a material having a slightly higher barrier or contact potential than the material of the catwhisker. Materials which have been found effective include chromium, nickel-chromium, cobalt, platinum, and alloys of chromium and platinum. Chromium and cobalt, in particular, provide superior results. The coated tip of the whisker makes pressure contact against the surface of the semiconductor die 10** providing a rectifying connection having improved characteristics.

As a typical example, devices in accordance with the invention were fabricated with standard ceramic cartridge enclosures of the type illustrated in FIG. 1 for use as mixer diodes in the X-band of microwave frequencies. Silicon dice were produced in the conventional manner by growing single crystal P-type silicon doped with boron to obtain a resistivity of about 0.006 ohm-centimeters. Each die included an epitaxial layer of intrinsic silicon about 1 micron thick on its upper surface.

The catwhisker electrodes 11 were fabricated by forming tungsten wire of about 3½ mils diameter into the S-shaped spring configuration. The tips of the electrodes were pointed and polished by the well-known electrolytic pointing technique employing a potassium hydroxide pointing solution. After appropriate cleaning, rinsing, and drying steps, the catwhisker electrodes were placed in a conventional sputtering apparatus and a thin coating of extremely pure material was sputtered onto the electrodes.

Bu virtue of employing sputtering techniques material of 99.9999 percent purity may be deposited on the electrodes. In addition, the cleaned tungsten electrodes are not exposed to other chemicals or possible sources of contamination. Therefore, the coating adheres well to the tungsten and only pure material acts in conjunction with the tungsten to form the rectifying contact to the silicon.

The sputtered coating may be from 400 to 1000 A. thick. A range of 400 to 600 A. is preferred. Although the various aforementioned materials may be employed to provide improved device characteristics, it has been found that coatings of either chromium or cobalt of the order of 400 A. thick provide the most significant improvement over prior art devices.

Figure 3:
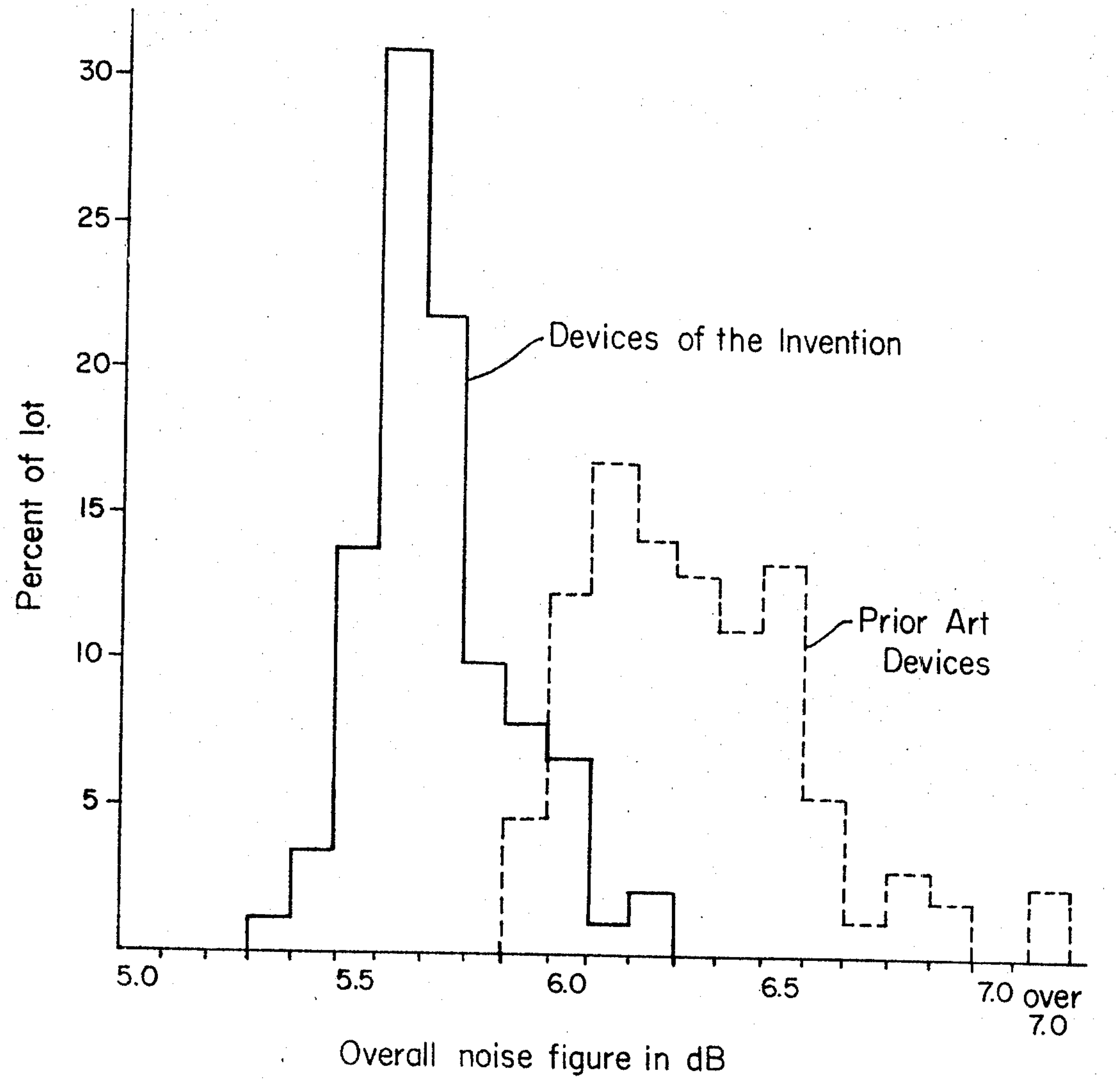

The improved electrical characteristics obtained in X-band mixer diodes according to the invention in comparison with prior art devices may be seen from the diagrams of FIG. 3. These diagrams illustrate the distribution by overall noise figure of a typical lot of prior art X-band mixer diodes and of a typical lot of X-band mixer diodes according to the invention. The diodes of the invention differed from the prior art devices in that their pointed tungsten catwhisker electrodes were each coated with a layer of chromium approximately 400 A. thick. Overall noise figure is a comparative criterion of electrical characteristics. It is a calculated figure expressed in decibels and takes into account the measured values of conversion loss and noise ratio and an assumed value of receiver IF amplifier noise. As can be seen from the diagrams a considerable improvement in overall noise figure has been obtained. A significant majority of devices according to the invention are superior to the few very best prior art devices.

Since the coating is of a material having slightly higher barrier or contact potential than the tungsten, the device capacitance per unit area of the contact is lower. Thus, the contact area can be increased by increasing the contact pressure, thereby improving device burnout characteristics without adversely affecting the overall noise figure.

While there has been shown and described what are considered preferred embodiments of the present invention, it will be obvious to those skilled in the art that various changes and modifications may be made therein without departing from the invention as defined in the appended claims.

What is claimed is:

1. A semiconductor electrical translating device comprising
   a body of semiconductor material,
   a pointed electrode of a material selected from the group consisting of tungsten and molybdenum,
   a coating of a material having a higher contact potential than said pointed electrode material and selected from the group consisting of chromium, nickel-chromium, cobalt, platinum, and alloys of chromium and platinum adherent to the pointed tip of the pointed electrode, and
   an enclosure supporting the body of semiconductor material and the pointed electrode with the coated tip of the electrode making pressure point contact rectifying connection with the surface of the body of semiconductor material.

2. A semiconductor electrical translating device in accordance with claim 1 wherein
   the pointed electrode is of tungsten,
   the coating is chromium sputtered onto the pointed tip of the pointed electrode, and
   the enclosure supports the body of semiconductor material and the pointed electrode with the coated tip of the electrode pressed into point contact rectifying connection with the surface of the body of semiconductor material.

3. A semiconductor electrical translating device in accordance with claim 2 wherein
   the semiconductor material of the body is silicon, and
   the sputtered coating of chromium is between 400 and 600 A. thick.

4. A semiconductor electrical translating device in accordance with claim 3 wherein
   the semiconductor material of the body is P-type silicon, and
   the sputtered coating is of chromium of at least 99.99 percent purity.

5. A semiconductor electrical translating device in accordance with claim 1 wherein
   the pointed electrode is of tungsten,
   the coating is cobalt sputtered onto the pointed tip of the pointed electrode, and
   the enclosure supports the body of semiconductor material and the pointed electrode with the coated tip of the electrode pressed into point contact rectifying connection with the surface of the body of semiconductor material.

6. A semiconductor electrical translating device in accordance with claim 5 wherein
   the semiconductor material of the body is silicon, and
   the sputtered coating of cobalt is between 400 and 600 A. thick.

7. A semiconductor electrical translating device in accordance with claim 6 wherein
   the semiconductor material of the body is P-type silicon, and
   the sputtered coating is of cobalt of at least 99.99 percent purity.

* * * * *